United States Patent [19]

Johnson

[11] 3,873,372

[45] Mar. 25, 1975

[54] METHOD FOR PRODUCING IMPROVED TRANSISTOR DEVICES

[75] Inventor: William S. Johnson, Hopewell Junction, N.Y.

[73] Assignee: International Business Machines Corporation, Armonk, N.Y.

[22] Filed: July 9, 1973

[21] Appl. No.: 377,851

[52] U.S. Cl. .................. 148/1.5, 148/187, 148/190, 357/91

[51] Int. Cl. .............................................. H01l 7/54

[58] Field of Search ...................... 148/1.5; 317/235

[56] References Cited

UNITED STATES PATENTS

| | | | |
|---|---|---|---|
| 3,479,237 | 11/1969 | Bergh et al. | 148/1.5 X |
| 3,596,347 | 8/1968 | Beale et al. | 148/187 X |
| 3,634,738 | 1/1972 | Leith et al. | 148/1.5 X |
| 3,653,978 | 4/1972 | Robinson et al. | 148/1.5 |
| 3,717,507 | 2/1973 | Abe | 148/1.5 |
| 3,747,203 | 7/1973 | Shannon | 148/1.5 X |

*Primary Examiner*—L. Dewayne Rutledge
*Assistant Examiner*—J. M. Davis
*Attorney, Agent, or Firm*—Wesley DeBruin

[57] ABSTRACT

The invention is concerned with methods for producing improved semiconductor devices. The invention is advantageously employable in the fabrication of insulated-gate field-effect transistor devices. The problem of accurately aligning the gate electrode over the channel region, lying between the source region and the drain region of a field effect transistor, is particularly addressed and solved. Accurate and precise field protection of all areas of the field-effect transistor surrounding the channel, source and drain regions is simply and effectively accomplished. The proper alignment of the gate electrode is largely accomplished by utilizing essentially the same mask structure to define the gate, source and drain regions. The same mask structure is utilized to define the area that is field protected.

43 Claims, 12 Drawing Figures

METHOD FOR PRODUCING IMPROVED TRANSISTOR DEVICES

BACKGROUND OF THE INVENTION

This invention relates to semiconductor devices and particularly to improved insulated-gate field effect transistor structures and method for producing said structures. More specifically the method includes within its accomplishments the accurate positioning of the gate electrode with respect to the source region and drain region, respectively, to provide improved performance of the field effect transistor. The improved performance is largely accomplished by a reduction in the parasitic capacitance.

Further, and significant to the improved performance of the field effect transistor the method provides field protection by subjecting the device at an appropriate stage during the construction of the device to bombardment by impurity ions of the same type as the background doping of the semiconductor body of the device. Field protection improves the performance of the device by materially reducing parasitic inversion and/or leakage current. Field protection also allows the use of more lightly doped substrate material which improves performance further by reducing parasitic junction capacitance.

The invention relates to transistor devices wherein the conductivity of a relatively shallow region in a semiconductor body is modulated by means of an electric field.

Operation of transistors of the insulated gate field effect type is based upon the control of a conduction channel in a semiconductor body. The channel is induced by an electric field established within the semiconductor body by an insulated control gate as well as by surface charges which may be ionic in nature. The transistors of the present invention are usually formed by deposition, diffusion and/or ion implantation techniques. In transistors the type to which the present invention is particularly directed, majority charge carriers (electrons or holes) flow through the solid state semiconductor material from an electrode usually called the "source." The conductive path for these charge carriers, hereinafter called the "channel" is modulated by an electric field and surface charges, and occurs at surface and near surface regions of the semiconductor body. In the absence of this induced channel, the flow of such charge carriers cannot occur. The charge carriers move or flow in the induced channel toward a second electrode called the "drain." The field effect in the semiconductor is established by a control or "gate" electrode and by this gate the conductivity of the channel and hence the marjority charge carrier current reaching the drain can be varied. This control electrode or "gate" is insulated from the semiconductor material to prevent the majority carriers from flowing to it. Normally, these devices are operated in a drain-voltage region where the drain current saturates, or reaches a maximum, nearly constant value because the channel is pinched off or terminated very close to the drain region and acts as a current generator, the current being only a function of the gate voltage and not of the drain voltage. Thus, these devices basically exhibit the useful drain voltage-drain current characteristic similar to a vacuum pentode.

Such devices are well-known in the art and the structure and operation thereof have been fully described in numerous publications. In one arrangement, the field-effect transistors have the source and drain electrodes disposed side by side with the gate arranged over the space between the source and drain and separated therefrom by an insulator. The gate electrode is insulated from the semiconductor material so that the gate electrode will not itself act as a source or drain electrode. The gate electrode exerts its control by field effect in the space between the source and drain electrodes.

It is recognized by the art that it is highly desirable to precisely position the gate electrode over the channel region between the source and drain regions of the device. This permits the channel region between the source and drain to be completely modulated by the gate. If the gate is too wide relative to the channel region, undesirable and excessive stray capacitance is developed which reduces the frequency response of the device. If the gate is too small relative to the channel region and does not cover it in its entirety, undesirable ohmic losses are introduced into the device and low transconductance may result or the device may not function. The mask alignment problems involved in prior devices having a small channel region are severe since an extremely narrow gate must be precisely fitted over the channel region. Often in such prior art devices some compromise was accepted and the gate electrode was intentionally permitted to overlap the drain region in order to relieve the mask alignment problem. As noted, this results in the introduction of an undesirable capacitance usually referred to as Miller feedback capacitance.

During operation of integrated circuit devices utilizing F.E.T.s voltages exist and currents are conducted within the interconnection layers between the devices. The interconnection system consisting of one or more metallurgy stripes is separated from the semiconductor body by a relatively thick layer of field insulation. The voltages and currents in the interconnection system cause electrical fields and charges to build up in, on and about the surface of the substrate and the overlying protective field insulation layer, which in turn gives rise to unwanted parasitic conduction paths along and near the device surface. Parasitic inversion of the field region of field effect transistors in integrated circuit devices is a common and serious problem, particularly in N channel type devices, and leads to current leakage. When parasitic conduction paths are allowed to extend from one active device to another, unwanted shorts and even catastrophic failures result. To control parasitic inversion, various methods are known in the art to control and prevent unwanted inversion. One technique is to provide special regions of increased conductivity to selected locations within the substrate in order to interrupt the inversion paths. These regions, usually formed by diffusion, are known as channel stops and are of the same conductivity as the substrate but with a higher surface concentration. Although satisfactory for some applications, the channel stop regions take up a relatively large portion of the available surface area thereby imposing serious restraints on the degree of miniaturization that can be achieved. For high density integrated circuits or complex arrays in which many field effect transistors are fabricated together in a small area on the substrate, the channel stop solution is unsatisfactory. Since parasitic inversion of the substrate surface is in general inversely proportioned to insulating layer thickness, unwanted parasitic inversion can also be reduced by increasing the thickness of the insulating layer. However, it is frequently impractical to increase the protective layer thickness to the extent necessary to control parasitic inversion due to fabricating difficulties. For example, it is difficult to substratively etch a relatively thick layer to very small geometries. Also, thick protective layers may develop contamination problems causing the electrical characteristics of the device to drift over a period of time. Another technique that has been suggested for controlling inversion is to imbed conductive layers in the field dielectric beneath the interconnection layers that are connected to the body of the device. This technique also has its limitations since it requires additional fabricating process steps demanding additional masking, etching and aligning steps which, in general, decrease the overall yield of the device.

Another technique which has been suggested is to increase the conductivity in the field regions by a diffusion or ion bombardment. The techniques known to the art for increasing the impurity concentration require additional masking and etching steps, as well as heating steps which cause device yield loss due to the probability of inherent misalignments and movement of the diffusions within the device.

A means for controlling unwanted inversion along the substrate surface of an F.E.T. device is therefore needed that does not reduce available surface area, does not interfere with subsequent processing steps, does not increase the oxide thickness above a practical limit, and does not increase the turn-on voltage. The method disclosed and claimed in this application includes means for fullfilling this need for field-protection in field effect transistors.

The illustrative embodiments of the invention are particularly directed to the manufacture of an improved Metal Oxide Semiconductor having Ehancement Mode and Depletion Mode characteristics. The desired characteristics of these devices are well known to those skilled in the art and need not be recited herein.

As stated earlier the characteristics of M.O.S. F.E.T. devices of the enhancement mode and depletion mode are well- known to those skilled in the art. The invention disclosed herein is primarily directed to reducing the stray capacitance within an F.E.T. device and eliminating the parasitic channels between FET devices contained within a single semiconductor body.

It is a primary objective of the invention to provide an improved field-effect transistor device.

It is a further object of the invention to provide an improved field-effect transistor device having low parasitic or stray capacitance.

It is a further object of the invention to provide an improved field-effect transistor device having reduced parasitic inversion.

It is a further object of the invention to provide an improved field-effect transistor in which the gate is precisely located over the channel region between the source and drain regions.

It is further an object of the invention to provide an improved field-effect transistor in which the gate electrode is precisely aligned horizontally and longitudinally with respect to the channel region.

It is a further object of the invention to provide an improved field-effect transistor in which the area of the device lying outside of the source, drain and channel regions is field protected.

It is further an object of the invention to provide an improved method for precisely locating the gate over the channel region.

It is a further object of the invention to provide an improved method for accomplishing field protection in field-effect transistor.

It is a further object of the invention to provide an improved field effect transistor of the enhancement mode type.

It is a further object of the invention to provide an improved field-effect transistor of the depletion mode type.

It is a further object of the invention to provide a large scale integrated semiconductor device having a plurality of improved enhancement mode field-effect transistors and/or a plurality of improved depletion mode field-effect transistors.

It is further an object of the invention to provide a large scale integrated semiconductor device having a plurality of improved enhancement mode field effect transistors interconnected with a plurality of improved depletion mode field effect transistors.

These and other objects of the invention are achieved by employing a common masking structure, and modification of portions of said common masking structure to define the drain region, source region, channel region, to precisely position the gate electrode over the channel region, and to define the areas subjected to field protect.

The invention will be described in greater detail by two illustrative embodiments, recited hereinafter, and by reference to the drawings in which:

FIGS. 1*a* through 1*g* are perspective views, partially in section, at successive stages of fabrication of field effect transistor devices in accordance with a first illustrative embodiment of this invention.

FIGS. 2*a* through 2*d* together with FIGS. 1*d* through 1*g* are perspective views, partially in section, at successive stages of fabrication of field effect transistor devices in accordance with a second illustrative embodiment of this invention.

FIG. 3 is an inverter circuit employing a depletion mode field effect transistor and an enhance mode field effect transistor. FIG. 3 is a circuit schematic employing the semiconductor device shown in FIG. 1*g*.

Reference is made to the copending U.S. Patent Application Ser. No. 374,152 filed June 27, 1973 by D. DeWitt and W. S. Johnson and entitled, "Field Effect Transistor Structure for Minimizing Parasitic Inversion and Process for Fabricating" and of common assignee herewith. Reference is also made to the text entitled, "Characteristics and Operation of MOS Field-Effect Devices," authored by Paul Richman and published by McGraw-Hill in 1967.

Reference is also made to the publication "Self-Alignment Technique for Fabricating High-Performance F.E.T.s" by W. S. Johnson, IBM Technical Disclosure Bulletin, July 1972, Vol. 15, No. 2, Pages 680 and 681.

DESCRIPTION OF THE PREFERRED EMBODIMENTS

First Embodiment

Figure 1A:
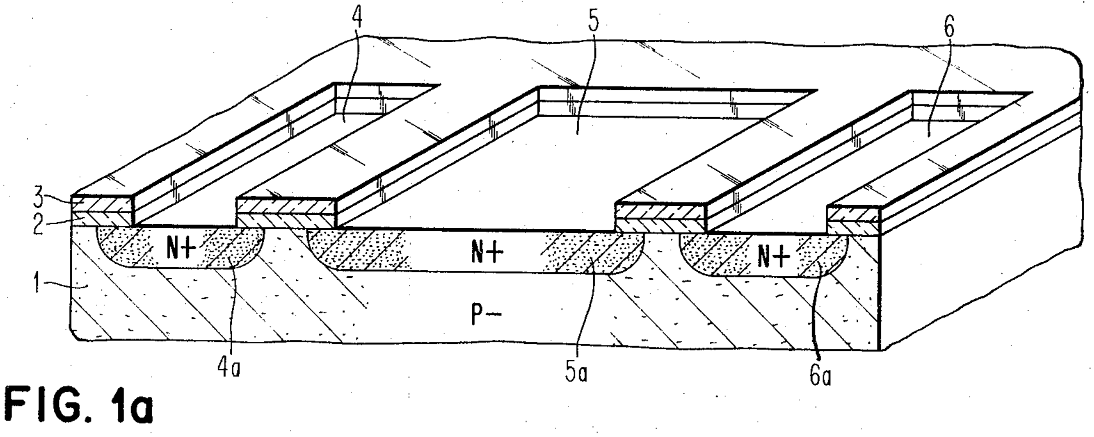

Referring now to the figures of the drawing, in particular FIG. 1*a* there is illustrated a semiconductor substrate 1 of $P^-$ conductivity type of region 11 (which overlay portions of regions 4*a*, 5*a* and 6*a*) as shown. The substrate material may be for example, silicon 10–20 ohm/cm resistivity. A thin layer of silicon dioxide 2 is formed on the surface of the semiconductor substrate. A thin layer of silicon nitride ($Si_3N_4$), 3 is formed on silicon dioxide layer 2. The silicon dioxide layer 2 and the silicon nitride layer 3 are formed on the substrate 1 by any suitable process. Suitable processes are well known in the art and detail discussion thereof is not deemed necessary. The silicon dioxide layer may be in the order of 500 Angstroms in thickness. The silicon nitride layer may be in the order of 300 Angstroms in thickness. Openings 4, 5 and 6 in the silicon nitride layer 3 and the silicon dioxode layer 2 are provided by well-known photolithographic techniques and processes.

For example, as is known in the art the structure of FIG. 1*a* may be arrived in the following manner. A thin layer of silicon dioxide 2 is formed on the surface of the semiconductor substrate 1. A thin layer of silicon nitride 3 is formed on the silicon dioxide layer 2. Now form a second thin layer of silicon dioxide (not shown in drawing) over said silicon nitride layer. Now employing well known photolithographic techniques etch openings 4, 5 and 6 in said second layer of silicon dioxide. Remove photoresist. Now etch silicon nitride with an etch that does not etch silicon dioxide. Now etch silicon dioxide. The resulting structure is represented in FIG. 1*a*.

By diffusion of suitable impurities the N+ surface regions 4*a*, 5*a* and 6*a* are formed in the semiconductor body 1.

Figure 1B:
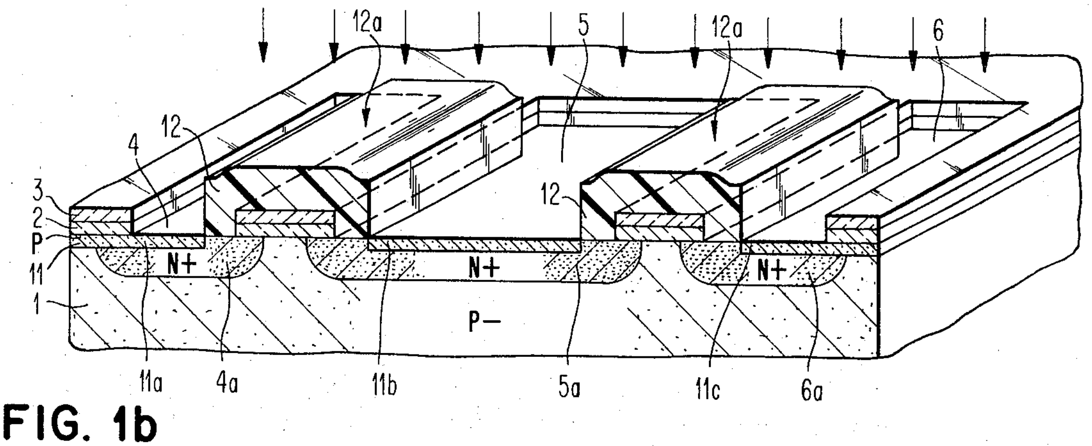

Reference is made to FIG. 1*b*. The structure of FIG. 1*a* has had a thick silicon dioxide layer deposited over the surface of the device by conventional chemical vapor deposition techniques. The C.V.D. oxide layer has been etched so that only the oxide material 12 remains. As will be more apparent from the description that follows the areas of the device underlying the oxide material 12 are effectively masked from field protection.

It is to be appreciated that the invention may be practiced by employing photoresist material in lieu of the chemically vapor deposited oxide material 12, FIG. 1*b*. would then be photoresist material.

Field protection is accomplished in the following manner. The surface of the device of FIG. 1*b* is subjected to blanket ion bombardment by an impurity of the same type as the background impurity of body 1. Boron ions may be used to bombard the semiconductor at a suitable energy sufficient to produce a region 11, underlying the silicon dioxide layer 2. For example, a boron ion dose of $2 \times 10^{13}$ ions/cm$^2$ at an energy of 110 keV may be used. The areas designated 11*a*, 11*b*, and 11*c*, are shown by the cross hatching to have been bombarded by Boron ions. However, these the N+ portions of regions remain N+ type, since the number of Borons ions implanted is not sufficient to significantly change the heavy concentration of N type impurity content therein.

The surface areas of the device underlying oxide material 12 are effectively masked from bombardment by boron ions. The oxide material 12 is of sufficient thickness that the energy of the bombarding Boron ions is not adequate to penetrate the surface of the body 1 underlying the oxide. Thus it is apparent that surface area of the device of FIG. 1*b* other than the N+ regions 4*a*, 5*a*, and 6*a* and areas covered by oxide material 12 are field protected. Namely the field protected surface area of the device of FIG. 1*b* is of P type as contrasted to the $P^-$ type of the lower portion thereof as viewed in FIG. 1*b*. It will be appreciated that the entire perimeter of the device surface as viewed in FIG. 1*b*, taking due, cognizance of the cross-sectionings is subjected to field protection. It is to be particularly recognized that the areas of the surface of the device to the rear of the regions covered by oxide material 12 and lying between N+ type surface areas 4*a* and 5*a*, and and 6*a* are accurately field protected. Namely, they are of P type after ion bombardment, as contrasted to $P^-$ type prior to field protection. As recited herein, field protection accurately and fully accomplished is effective in eliminating or reducing parasitic inversion, parasitic channels and leakage currents within and between F.E.T. devices on a common substrate.

Figure 1C:
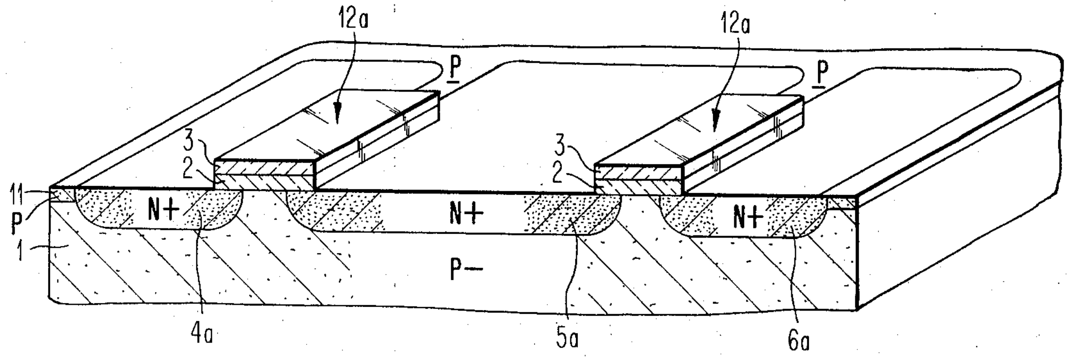

Referring to FIGS. 1*b* and 1*c*, the $Si_3N_4$ layer 3 is removed by a suitable nitride etch, for example, phosphoric acid and techniques known to the art. The $SiO_2$ layer 2 is then removed by an appropriate oxide etchant for example buffered hydrofluoric acid. The nitride etchant does not materially act upon the oxide material 12 as viewed in FIG. 1*b*. The oxide etchant removes oxide material 12 as well as oxide layer 2 wherever the $Si_3N_4$ layer has been removed. The device at this stage of its fabrication is represented by the structure shown in FIG. 1*c*.

As will be more fully apparent upon the completion of this illustrative embodiment, the oxide material 12 and the silicon nitride layer 3 underlying said oxide comprise the mask structure that accomplishes the precise self registration of the source region, channel region, drain region as well as the field-protected region.

Figure 1D:
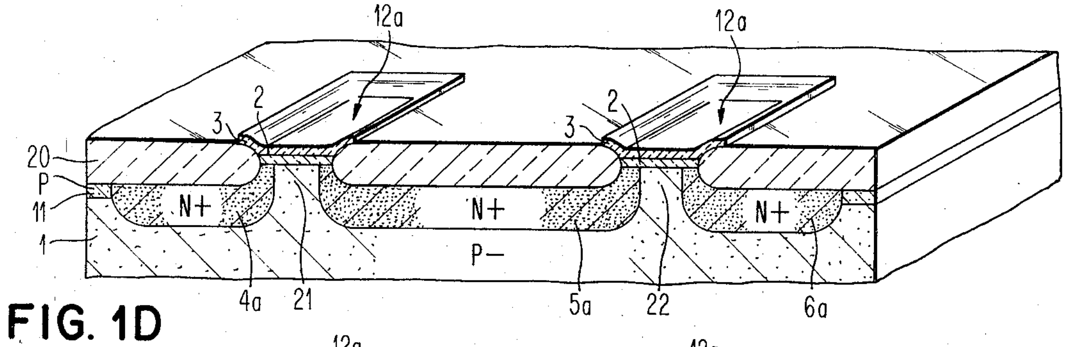

Referring to FIG. 1*c* and 1*d* a relatively thick silicon dioxide coating 20 is grown over the surface of the device. It is to be noted that silicon dioxide is not grown to any appreciable extent on the surfaces 12*a* of the $Si_3N_4$ layer 3 as viewed in FIG. 1*d*. The structure of the device at this stage in its fabrication is represented in FIG. 1*d*. The entire structure of the device except for area 12*a* is covered by a relatively thick oxide coating 20. The rectangular areas 12*a* p84 of silicon nitride layer 3 cover a thin layer of silicon dioxide 2. It is to be noted that the channel regions generally defined at this stage in the fabrication of the device by areas 21 and 22 are aligned under the rectangular areas 12*a*, respectively.

Figure 1E:
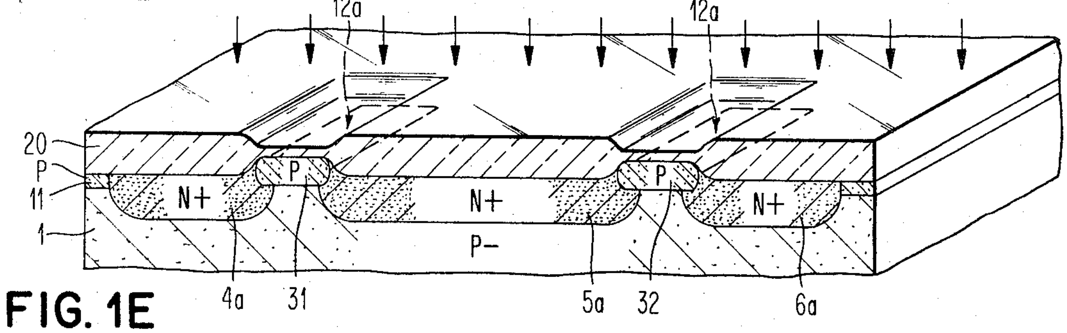

Referring to FIGS. 1*d* and 1*e* the surface of the structure shown in FIG. 1*d* is now subjected to a nitride etch, to remove in the essentially rectangular areas 12*a* the silicon nitride layer 3. Subsequent to the employment of the nitride etch the surface of the device is subjected to a suitable silicon dioxide etch. The oxide etch is of limited duration since the object is to merely remove the silicon dioxide layers 2 in rectangular areas 12*a* underlying what will subsequently become the gate electrode areas. A relatively thin silicon dioxide layer is now grown over the entire surface of the device, the object being to provide a more homogenous or pure thin oxide layer over the areas that will become the gate regions. The gate oxide may be, for example, 500A thick. Now as viewed in FIG. 1*e* the entire surface of the device is subject to a blanket ion bombardment by an impurity of the same type as the background impurity of the semiconductor body 1. In this illustrative example, boron ions are used to bombard the semiconductor at a suitable energy sufficient to produce P type regions 31 and 32. The energy of the boron ions that bombard the surface of the device of FIG. 1*e*, other than the gate regions (areas 12*a*) is not sufficient to penetrate thick oxide coating 20. The presence of borons ions within the thick oxide layer 20 does not materially change the characteristics of the silicon dioxide layer 20. For example, a boron ion dose of $7\times10^{11}$ ions/cm$^2$ at 35 keV energy may be employed. FIG. 1*e* is a representation of the structure of the device at this stage of its fabrication.

Figure 1F:
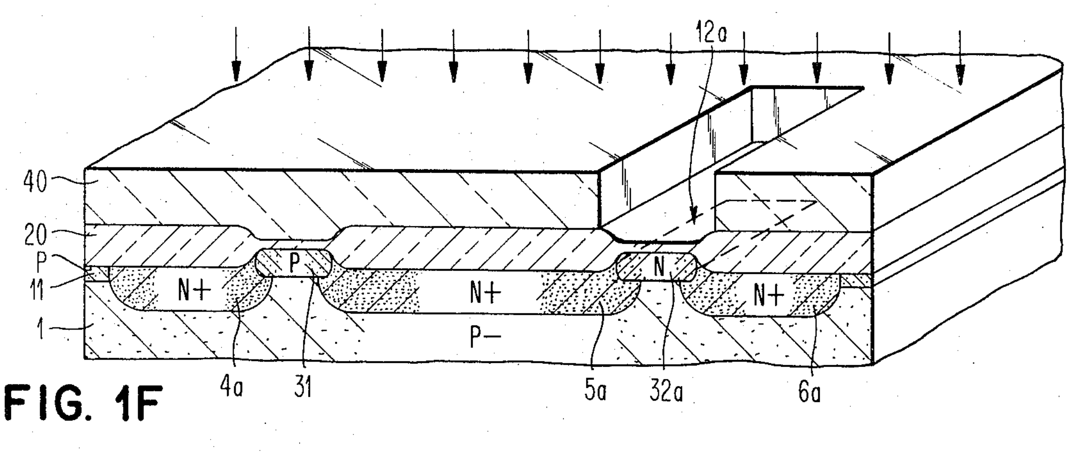

Referring to FIGS. 1*e* and 1*f* by conventional photolithographic techniques a photoresist layer 40 with a window 41 is deposited, exposed and developed to cover the surface of the device of FIG. 1*e*. The structure of the device at this stage is shown in FIG. 1*f* with photoresist layer 40 having a window 41. The surface of the device of FIG. 1*f* is now subjected to a blanket ion bombardment by an impurity of the opposite type to the background impurity of the semiconductor body 1. In short, in this illustrative example, the background of the device is of P type and the impurity is of N type. For example, phosphorus ions at an energy of 100 keV and a dose at $1.4\times10^{12}$ ions/cm$^2$ may be used to bombard the surface of the device of FIG. 1*f* to produce N type region 32*a*. It will be appreciated in summary that P type region 32 of FIG. 1*e* has by ion implantation become N type region 32*a* of FIG. 1*f*.

Figure 1G:
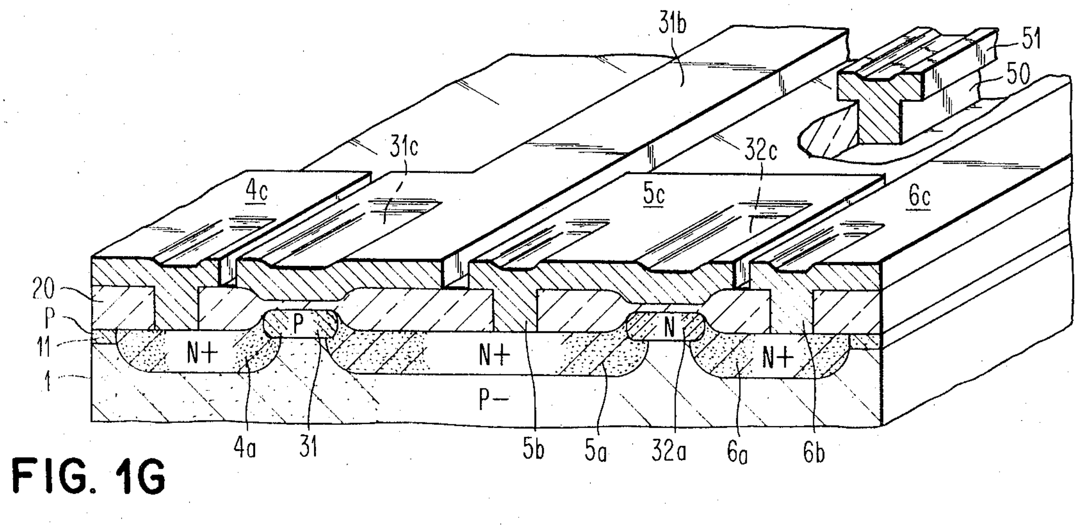

Referring to FIGS. 1*f* and 1*g* the photoresist layer 40 is now removed by conventional techniques. Conventional phosphosilicate glass (P.S.G.) stabilization is employed at this stage in the fabrication of the device, including deposition of P.S.G. and subsequent anneal. This anneal also serves to anneal the ion implants. Contact openings 4*b*, 5*b*, 6*b*, and 50 in silicon dioxide layer 20 are now made by using conventional photolithographic and masking techniques. A blanket layer of aluminum is now deposited on the surface of the device. The aluminum layer is now subetched and further processed by well-known techniques to provide discrete device contacts 4*c*, 31*b*, 5*c*, 6*c* and 51.

As will be more apparent hereinafter the semiconductor device of FIG. 1*g* includes a field effect transistor of the depletion mode type and a field effect transistor of the enhancement mode type. A common connection, electrical contact 5C, interconnects the source and gate regions of the field effect transistor of the depletion mode type with the drain region of the field effect transistor of the enhancement mode type. Hereinafter a field effect transistor of the enhancement mode type will be designated by F.E.T.E.M. and a field effect transistor of the depletion mode type will be designated by F.E.T.D.M.

Reference is made to FIG. 1*g*. Electrical contact 4*c*, via opening 4*b*, is connected to the source 4*a* of the F.E.T.E.M. Electrical contact 31*b* is connected to the gate electrode 31*c* of the F.E.T.E.M. Electrical contact 5*c* via opening 5*b*, is connected to the drain 5*a* of the F.E.T.E.M. and to the source 5*a* of the F.E.T.D.M. Electrical contact 5*c* is also connected to gate electrode 32*c* of the F.E.T.D.M. Electrical contact 6*c*, via opening 6*b* makes contact with the drain 6*a* of the F.E.T.D.M. Electrical contact 51, via opening 50 makes contact to the semiconductor substrate 1. Electrical contact 51 is termed the substrate contact.

Figure 3:
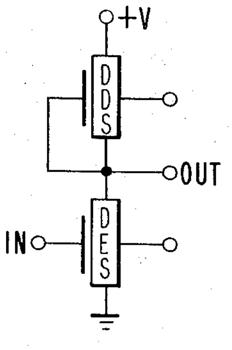

Referring to FIGS. 1*g* and 3 it will be evident that the device shown in FIG. 1*g* is readily employable as an inverter circuit.

Although illustrative embodiments of the invention disclosed herein are directed to an F.E.T. device readily employable as an inverter, the invention is not to be interpreted or construed as limited to such structures and devices.

The invention is readily employable by those skilled in the art, as disclosed, or with obvious modification and adaptation to a wide variety of semiconductor devices and structures.

It is further to be appreciated that in an alternative embodiment of the invention the $Si_3N_4$ layer overlying the channel areas (FIG. 1*d*) need not be removed. The structure of FIG. 1*g* would then have a thin layer of $Si_3N_4$ and of oxide overlying the channels 31 and 32*a*. Namely, the gate insulators would be the thin layers of $Si_3N_4$ and $SiO_2$ represented by areas 12*a* in FIG. 1*d*.

Second Embodiment

The second embodiment of the invention will now be described with reference to FIGS. 2*a* through 2*d* and 1*d* through 1*g* of the drawing.

Figure 2A:
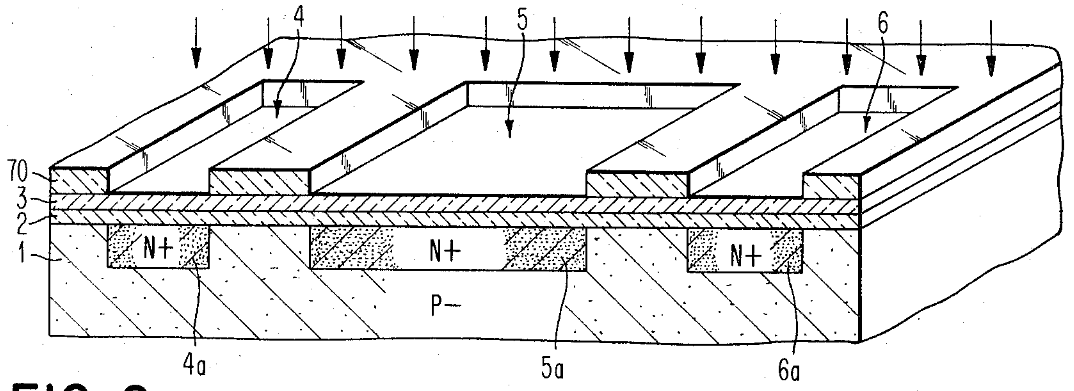

Referring to FIG. 2*a* a thin layer 2 of thermal oxide is formed on silicon semiconductor substrate 1. Substrate 1 is of $P^-$ type silicon semiconductor material. A thin silicon nitride ($Si_3N_4$) layer 3 is deposited on layer 2, and a relatively thick layer 70 of chemically vapor deposited oxide is formed over layer 3. As indicated in FIG. 2*a*, openings or windows 4, 5, and 6 are cut or formed through the relatively thick chemically vapor deposited oxide layer 70. The windows, 4, 5 and 6 may be formed using conventional photolithographic techniques. N+ regions 4*a*, 5*a*, and 6*a* of the device of FIG. 2*a* are formed by ion implantation through the thin silicon nitride layer 3 and silicon dioxide layer 2 in the surface areas of the semiconductor substrate 1 underlying windows 4, 5 and 6. Phosphorus or arsenic ions may be utilized to form N+ regions 4*a*, 5*a* and 6*a*. The ions may be implanted using 150 keV with an ion density of $5\times10^{15}$ atoms/cm sq. At this stage in its fabrication the device to schematically represented as shown in FIG. 2*a*.

Figure 2B:
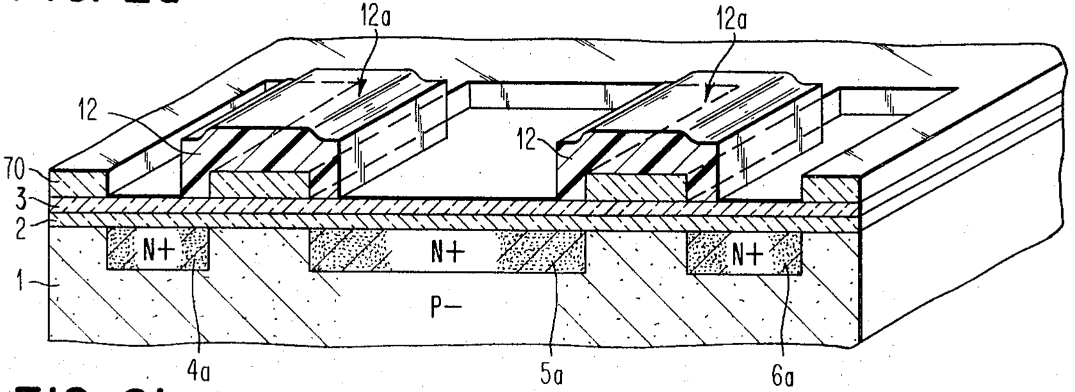

Reference is made to FIGS. 2*a* and 2*b*. The surface of the device shown in FIG. 2*b* has had deposited thereon a layer of photoresist. The photoresist is exposed and developed by conventional techniques such that only the photoresist portions 12 as shown in FIG. 2*b* remain. It will be noted that the photoresist portion 12 overlies defined areas of the surface of the device of FIG. 2*b*. The first region covered photoresist 12 is an essentially rectangular area lying between N+ type regions 4*a* and 5*a*. The second region covered by photoresist 12 lies between N+ type regions 5*a* and 6*a* and is also essentially rectangular. The second region is essentially equivalent in configuration to the first region. The structure of the device is now as represented in FIG. 2*b*.

Figure 2C:
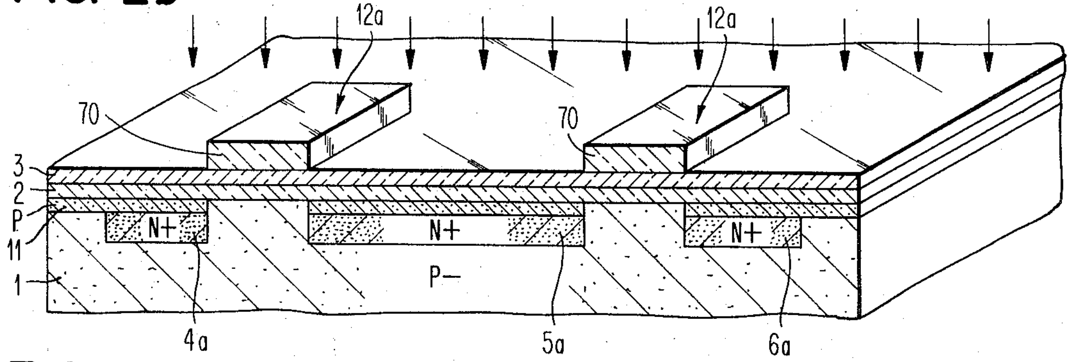
Figure 2D:
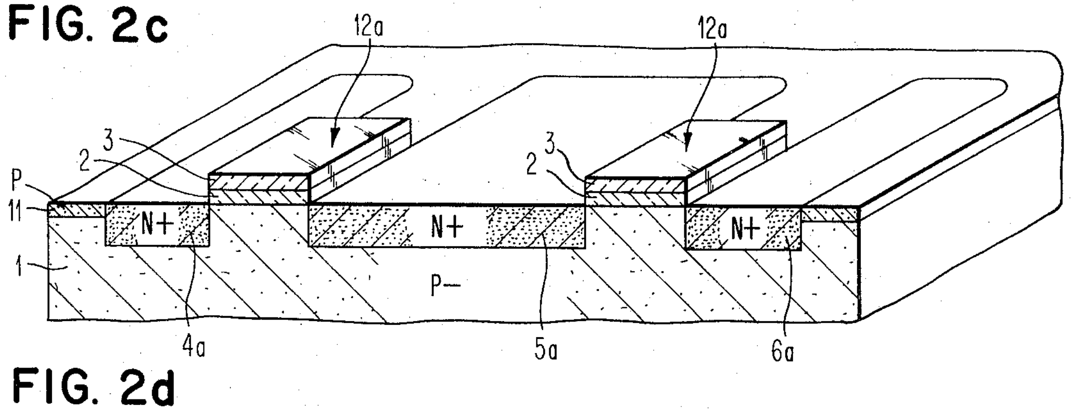

Reference is now made to FIGS. 2*b* and 2*c* of the drawing. The chemically vapor deposited oxide layer 70 of FIG. 2*b* is removed by a suitable etchant from the surface of the device. As seen from FIG. 2*c* the oxide layer 70 will not be removed by etching from areas 12*a* underlying photoresist material 12. Photoresist material 12 is now removed by conventional techniques. As will be more apparent from the description that follows the areas 12*a* of the device underlying the remaining oxide layer 70 of the device of FIG. *2c* are effectively masked from field protection.

Field protection is accomplished in the following manner. The surface of the device of FIG. *2c* is subjected to blanket ion bombardment by an impurity of the same type as the background impurity of body 1 which in this illustrative embodiment is P type. Boron ions at a suitable energy may be used to bombard the surface of the semiconductor 1 to produce a region 11 which just underlies the silicon dioxide layer 2. The regions designated 11*a*, 11*b* and 11*c* having at least one planar surface in FIG. *2c* are shown by cross-hatching to have been bombarded by Boron ions. However, these regions remain N+ type, since the number of Boron ions implanted per unit volume in the N+ type regions is not sufficient to significantly effect the relatively heavy concentration of N type impurity therein.

The surface areas 12*a* of the device of FIG. *2c* underlying chemically vapor deposited oxide portions 70 are effectively masked from bombardment of Boron ions. The oxide portions 70 are of sufficient thickness that the energy of the bombarding Boron ions is not adequate to penetrate through said portions.

Thus it is apparent that the surface area of the device of FIG. *2c* other than the N+ regions *4a*, *5a*, and *6a* and essentially rectangular areas 12*a* underlying the oxide portions 70 have been field protected. Namely, the field protected surface area of the device of FIG. *2c* are of P type as contrasted to the $P^-$ type of the lower portion of the device. It will be appreciated that the entire perimeter of the device as viewed in FIG. *2c*, has been field protected. It is to be particularly recognized that the areas of the device surface behind the oxide portions 70 as viewed in FIG. *2c* and lying between the N+ regions *4a* and *5a*, and *5a* and *6a*, respectively, have been precisely field protected. Namely, these areas are now of P type in the device of this illustrative embodiment. The advantages of accurately and fully providing field protection to the structure of a field effect transistor are recited earlier herein and are well-known to the art.

Reference is now made to FIGS. *2c* and *2d*. *By a suitable etchant and known techniques the* $Si_3N_4$ layer 3 is removed in all areas of the device as shown in FIG. *2c* except the generally rectangular areas 12*a* underlying oxide portions 70. The surface of the device is now subjected to a suitable oxide etchant such as for example buffered hydrofluoric acid, to remove the relatively thin oxide layer 2 and oxide portions 70. It is to be noted as viewed in FIG. *2d* that the areas 12*a* of the surface of the device are still covered by a thin oxide layer 2 and a thin silicon nitride layer 3. At this stage in the fabrication of the device, the structure thereof is as represented in FIG. *2d*.

Attention is now directed to FIGS. *2d* and *1c*. It will be appreciated from the figures that at this stage of the fabrication of the device in accordance with the instant illustrative example, (FIG. *2d*) and at the stage of the fabrication of the device in accordance with the first illustrative example represented by FIG. *1c* the resulting structure is essentially identical. It will be noted that in FIG. *1c* the N+ regions are depicted in a manner that represents their formation by a diffusion technique, whereas in FIG. *2d* the N+ regions are depicted in a manner that represents their formation by an ion implant technique. Other than as recited above the structures represented by FIGS. *1c* and *2d* are identical.

FIGS. *1d* through *1g* and the accompanying description of the first illustrative embodiment may now be employed to complete the device of the second illustrative embodiment.

FIG. *1g* may now be viewed as the structure of the device fabricated in accordance with either the first or the second illustrative embodiment.

In the illustrative embodiments set forth above certain techniques and steps, which are conventional and well known to those skilled in the art, have not been expressly recited for purposes of brevity. For example, "cleansing" of the semiconductor and its surfaces, annealing the surface of the semiconductor surface after ion bombardment or ion implantation, etching conditions such as time and temperature, and other techniques known to the art.

A succinctly stated listing of steps that may be followed to practice the invention is set-forth below:

1. Take 14–18 ohm cm. $P_-$ type, 1-0-0 oriented silicon
2. Clean
3. Grow dry thermal oxide at 970C, 500A thick
4. Chemically vapor deposit 400A silicon nitride at 800°C
5. Chemically vapor deposit 2100A silicon dioxide at 800°C
6. Define by photolithography source and drain areas
7. Etch through 2,100A silicon dioxide
8. Remove photoresist
9. Etch silicon nitride
10. Etch 500A silicon dioxide in source and drain areas and 2,100A silicon dioxide from remaining area
11. Perform arsenic capsule diffusion
12. Deposit 10,000A silicon dioxide
13. Define by photolithography the gate areas (leave photoresist on gates, remove elsewhere)
14. Etch 10,000A oxide
15. Remove photoresist
16. Ion implant $2\times10^{13}$ boron ions/cm$^2$ at 110 keV
17. Etch silicon nitride from all regions exterior to gates
18. Etch 500A silicon dioxide from all areas exterior to gates and 10,000A deposited oxide from gates
19. Grow 6,500A wet oxide at 970°C
20. Dip etch nitride from gate areas
21. Dip etch 500° oxide from gate regions
22. Regrow 500A dry thermal oxide at 970° in gate regions
23. Ion implant enhancement mode threshold adjust with $7.9\times10^{11}$ boron ions/cm$^2$ at 30 KeV
24. Define with photolithography openings over depletion-mode gates
25. Ion implant depletion mode threshold adjust with $2.4\times10^{12}$ phosphorous ions/cm$^2$ at 95 keV
26. Remove photoresist
27. Deposit phosphosilicate glass stabilization layer at 800°C
28. Anneal at 1,050°C for 15 minutes in nitrogen
29. Define with photolithography contact holes
30. Etch contact holes
31. Remove photoresist
32. Evaporate aluminum metal
33. Define by photolithography metal pattern
34. Etch metal
35. Remove photoresist
36. Anneal metal for 20 minutes at 400°C in nitrogen 37. Test device A second succinctly stated listing of steps that may be followed to practice the invention is set-forth below:

1. Take 14–18 ohm cm. $P^-$ type, 1-0-0 oriented silicon
2. Clean
3. Grow dry thermal oxide at 970°C, 500A thick
4. Chemically vapor deposit 400° silicon nitride at 800°C
5. Chemically vapor deposit 10,000A silicon dioxide at 800°C
6. Define by photolithography source and drain areas
7. Etch through 10,000A silicon dioxide
8. Remove photoresist
9. Ion implant source and drain with $5\times10^{15}$ phosphorous ions/$cm^2$ at 150 keV
10. Define by photolithography the gate regions (leave photoresist on gates and remove elsewhere)
11. Etch through 10,000A deposited silicon dioxide
12. Remove photoresist
13. Ion implant $2\times10^{13}$ boron ions/$cm^2$ at 110 keV
14. Etch silicon nitride from all regions exterior to gates
15. Etch 500A silicon dioxide from all areas exterior to gates and 10,000A deposited oxide from gates
16. Grow 6,500A wet oxide at 970°C
17. Dip etch nitride from gate areas
18. Dip etch 500A oxide from gate regions
19. Regrow 500A dry thermal oxide at 970°C in gate regions
20. Deposit phosphosilicate glass stabilization layer at 800°C
21. Anneal at 1,050°C for 15 minutes in nitrogen
22. Ion implant enhancement mode threshold adjust with $7.9\times10^{11}$ boron ions/$cm^2$ at 30 keV
23. Define with photolithography openings over depletion-mode gates
24. Ion implant depletion mode threshold adjust with $2.4\times10^{12}$ phosphorous ions/$cm^2$ at 95 keV
25. Remove photoresist
26. Anneal at 900°C for 20 minutes in nitrogen
27. Define with photolithography contact holes
28. Each contact holes
29. Remove photoresist
30. Evaporate aluminum metal
31. Define by photolithography metal pattern
32. Etch metal
33. Remove photoresist
34. Anneal metal for 20 minutes at 400°C in nitrogen
35. Test device It will be appreciated that in the second illustrative embodiment the same relatively thick chemically vapor deposited oxide layer is used for masking the source and drain implants and for masking the nitride etch. Since the nitride, in turn, was used to mask the thick oxide growth, an automatic alignment between the edges of the diffusion and the edges of the active gate region is produced.

As is apparent from the second illustrative example, the relatively thick oxide portions 70 (see FIG. 2*c*) and the silicon nitride layer 3 underlying said portion is the mask structure that accomplishes the precise self registration of the source region, channel region and gate electrode.

It will not be apparent from illustrative embodiments one and two how a common masking structure, and modifications and portions of said common masking structure accomplish in an F.E.T. structure, precisely and accurately defining the source region, the channel region, the drain region, precisely aligning the gate electrode over the channel region and accurately and precisely defining the area subjected to field protection.

While this invention has been particularly described with reference to the preferred embodiments thereof, it will be understood by those skilled in the art that the foregoing and other changes in form and details may be made therein without departing from the spirit and scope of the invention.

What is claimed is:

1. A method of fabricating a semiconductor device having first, second and third spatially separated regions of a first conductivity type said regions respectively, lying on and within a planar surface of a semiconductor substrate of second conductivity type, said first conductivity type being opposite to said second conductivity type, a fourth region of said second conductivity type extending from said first region to said second region, and a fifth region of said first conductivity type extending from said second region to said third region, said method comprising:

A. forming a first relatively thin insulating layer of a first material on said planar surface of said semiconductor substrate, B. forming a second relatively thin insulating layer of a second material on said first insulating layer, C. forming a third relatively thick insulating layer of a third material on said second insulating layer, D. removing first, second and third spatially separated portions of said third insulating layer to expose first, second and third areas of said second insulating layer, E. bombarding the surface of said substrate with impurity ions of said first conductivity type at an energy sufficient to penetrate through said first and second insulating layers and insufficient to penetrate through said first, second and third insulating layers, whereby said first, second and third spatially separated regions of said first conductivity type are formed on and within said planar surface of said semiconductor substrate, F. forming a fourth relatively thick insulating layer of a fourth material over the surface of said device, G. removing all of said fourth insulating layer except for two discrete portions thereof, respectively covering a first predetermined precisely located area on the surface of said device and a second predetermined precisely located area on the surface of said device, said first portion wholly covering portions of said first, second and third insulating layers where said first, second and third insulating layers overlay an area of said planar surface of said semiconductor substrate extending from said first region to said second region, said second portion wholly covering portions of said first, second and third insulating layers, where said first, second and third insulating layers overlay an area of said planar surface of said semiconductor substrate extending from said second region to said third region, H. removing said third insulating layer except for the portions underlying said first and second portions of said fourth insulating material, I. removing said portions of said fourth insulating material, J. bombarding the surface of said substrate with impurity ions of said second conductivity type at an energy sufficient to penetrate the planar surface of said semiconductor in the area covered solely by said first and second insulating layers whereby said first and second predetermined precisely located areas of said planar surface of said semiconductor substrate covered by said first, second and third layers of insulating material are not subjected to bombardment by impurity ions of said second conductivity type, K. removing said second insulating layer from the planar surface area of said device only where the planar surface of said device is solely covered by said first and second insulating layers, L. removing said first insulating layer from the planar surface of said device only where the planar surface of said device is solely covered by said first insulating layer, M. removing said third layer of insulating material from the planar surface of said device where said planar surface of said device is solely covered by said first, second and third insulating layers, N. forming a first relatively thick insulating coating on the entire area of said planar surface of said semiconductor device except for said first and second predetermined precisely located areas on the planar surface of said semiconductor device, O. removing said second insulating layer from said first and second predetermined precisely located areas on the planar surface of said semiconductor device, P. removing said first insulating layer from said first and second predetermined precisely located areas on the planar surface of said semiconductor device, Q. forming a second relatively thin coating of insulating material over the entire planar surface area of the device, R. bombarding the entire planar surface of said device with impurity ions of said second conductivity type at an energy sufficient only to form said fourth region of said second conductivity type lying on and within said planar surface of said semiconductor substrate and a sixth region of said second conductivity type lying on and within said planar surface of said semiconductor substrate, said fourth and said sixth regions of said second conductivity type respectively corresponding identically in area and location on said planar surface to said first and second predetermined precisely located areas on said planar surface of said semiconductor device, S. forming a relatively thick fifth layer of insulating material over the planar surface of said device, T. opening a window area in said fifth insulating area, said window at least fully encompassing said second predetermined precisely located area on said planar surface of said semiconductor device, U. bombarding the entire planar surface of said device with impurity ions of said first conductivity type at an energy sufficient only to cause said sixth region of said second conductivity type to become said fifth region of said first conductivity type, said fifth region corresponding identically in area and location to said second predetermined precisely located area on said planar surface of said semiconductor substrate, V. removing said fifth layer of insulating material, W. cutting a plurality of discrete spatially displaced contact openings in said first relatively thick insulating coating to expose said planar surface of said semiconductor substrate at said openings, X. forming a plurality of discrete electrical contacts on the resultant device.

2. The method of claim 1 wherein said first relatively thin insulating layer is silicon dioxide, said second relatively thin insulating layer is silicon nitride, said third relatively thick insulating layer is silicon dioxide, said fourth relatively thick insulating layer is photoresist material, said first relatively thick insulating coating is silicon dioxide, said second relatively thin insulating coating is silicon dioxide, said relatively thick fifth insulating layer is photoresist, said first region of first conductivity type is the source of a first field effect transistor, said fourth region of second conductivity type is the channel of said first field effect transistor, said second region of said first conductivity type is the drain of said first field effect transistor and the source of a second field effect transistor, said fifth region of said first conductivity type is the channel of said second field effect transistor, and said third region of said first conductivity type is the drain of said second field effect transistor.

3. The method of claim 2 wherein said semiconductor substrate is 1-0-0 oriented silicon, of 14 to 18 ohm cm. $P^-$ type, said first relatively thin layer of silicon dioxide is approximately 500A in thickness and is dry thermally grown at approximately 970°C, said second relatively thin layer of silicon nitride is approximately 400A in thickness and is chemically vapor deposited at 800°C, said third relatively thick layer of silicon dioxide is approximately 10,000A in thickness and is chemically vapor deposited at 800°C, said first relatively thick coating of silicon dioxide is approximately 6,500A in thickness and is wet grown at approximately 900°C, said second relatively thin coating of silicon dioxide is approximately 500A in thickness and dry grown at approximately 970°C.

4. The method of claim 3 wherein said two discrete portions of photoresist material respectively overlay a first predetermined precisely located area on the surface of said device and a second predetermined precisely located area on the surface of said device, said first portion wholly covering portions of said first, second and third insulating layer where said first, second and third insulating layers overlay an area of said planar surface of said semiconductor substrate extending from said first region to second region, said second portion wholly covering portions of said first, second and third insulating layers, where said first, second and third insulating layers, overlay an area of said planar surface of said semiconductor substrate extending from said second region to said third region, where said two discrete portions of photoresist and said layers underlaying said portions are common masking structures respectively and with modification utilized to precisely define the locations of the channels of said first and second field effect transistors, the accurate positioning of gate electrodes over said channels and the planar area of said semiconductor device that is field protected.

5. In a method for fabricating a semiconductor device having a semiconductor substrate of a first conductivity type, said substrate having at least one planar surface on which adjacently spaced first, second and third regions of a second conductivity type have been formed, a first layer of relatively thin insulating material has been formed on a first precisely defined area of said planar surface extending from said first region to said second region, a second layer of relatively thin insulating material has been formed on second precisely defined area of said planar surface extending from said second region to said third region wherein the improved method comprises the steps A. forming a relatively thick third layer of insulating material over said entire planar surface except said first and second areas,
B. providing a fourth region of said first conductivity type in said planar surface beneath said first area,
C. providing a fifth region of said second conductivity type beneath said second area,
D. providing three electrical contacts respectively to said first, second and third regions of said planar surface,
E. providing two electrical contacts, respectively overlaying said first and second relatively thin layers of insulating material on said first and second precisely defined area of said planar surface, whereby fourth and fifth regions are respectively capacitively coupled to said two electrical contacts.

6. In a method for fabricating a semiconductor device as recited in claim 5 wherein said first and second layers of relatively thin insulating material each consist of a relatively thin layer of silicon dioxide formed on said planar surface and a relatively thin layer of silicon nitride formed on said thin layer of silicon dioxide, and said relatively thick third layer of insulating material is silicon dioxide of approximately 6,500 to 10,000 A in thickness.

7. In a method for fabricating a semiconductor device as recited in claim 6 wherein subsequent to step (a) of claim 6 and prior to step (b) of claim 6 the following steps are performed:

a-1. said relatively thin layers of silicon nitride are removed,
a-2. said relatively thin layers of silicon dioxide are removed, and
a-3. a relatively thin layer of silicon dioxide is formed over the entire planar surface of the device whereby said first and second precisely defined areas of said planar surface are respectively overlayed with a layer of silicon dioxide of approximately 500A in thickness.

8. In a method of fabricating a semiconductor device as recited in claim 6 wherein said relatively thin silicon nitride layer is approximately 400A in thickness, said relatively thin silicon dioxide layer is approximately 500 A in thickness and said relatively thick layer of silicon dioxide is approximately 6,500A in thickness.

9. A method of fabricating a semiconductor device having first, second and third spatially separated regions of a first conductivity type, respectively lying on and within a planar surface of a semiconductor substrate of second conductivity type, said first conductivity type being opposite to said second conductivity type, a fourth region of said second conductivity type extending from said first region to said second region, and a fifth region of said first conductivity type extending from said second region to said third region, said method comprising:

A. forming a first insulating layer of a first material on said planar surface of said semiconductor substrate,
B. forming a second insulating layer of a second material of said first insulating layer,
C. selectively removing portions of said first and second insulating layers to expose first, second and third discrete portions of said planar surface of said semiconductor substrate, said first exposed surface being spaced adjacent to said second exposed surface and said second exposed surface being spaced adjacent to said third exposed surface,
D. introducing impurities of said first conductivity type into said semiconductor substrate via said first, second and third exposed portions of said planar surface of said semiconductor substrate, whereby said first, second and third spatially separated regions of said first conductivity type are formed,
E. forming first and second segments of insulating material, said first segment of insulating material overlaying portions of said first and second insulating layers in a first precisely located area of said planar surface extending from said first region to said second region, and said second segment of insulating material overlaying portions of said first and second insulating layers in a second precisely located area of said planar surface extending from said second region to said third region,
F. introducing impurities of said second conductivity type into the entire planar surface of said semiconductor substrate except said first and second precisely located areas of said planar surface, which respectively underlay said first and second segments of insulating material,
G. removing said entire first and second layers of insulating material except the portions of said first and second insulating layers underlying said first and second segments of insulating material,
H. removing said first and second segments of insulating material whereby said entire planar surface of said semiconductor substrate is exposed except said first and second precisely located areas which respectively underlay said portions of said first and second insulating layers,
I. forming a relatively thick coating of insulating material over substantially the entire planar surface of said semiconductor substrate, where substantially the entire planar surface of said semiconductor substrate is defined as the entire planar surface of said semiconductor substrate except for said first and second precisely located areas,
J. introducing impurities of said second conductivity type into a region of said planar surface of said semiconductor substrate bounded by said first precisely located area, whereby said fourth region of said second conductivity is provided,
K. introducing impurities of said first conductivity type into a region of said planar surface of said semiconductor substrate bounded by said second precisely located area, whereby said fifth region of said first conductivity type is provided, and
L. providing the device with electrical contacts.

10. In a method for fabricating a semiconductor device including a semiconductor substrate with a planar surface having first, second, third, fourth and fifth regions lying on and within said planar surface of said semiconductor substrate, said substrate and said second region being of a first conductivity type and said first, third, fourth and fifth being of a second conductivity type, the steps comprising:

A. forming a first insulating mask layer of material on said planar surface of said semiconductor substrate;
B. forming a second insulating mask layer over said first insulating mask layer;
C. opening first, second and third discrete windows in said first and second mask layers to expose first, second and third discrete areas on said planar surface;
D. introducing impurities of a second conductivity type into said semiconductor substrate in regions underlying said first, second and third areas, whereby said first, third and fifth regions of said second conductivity type are formed;
E. removing said second insulating mask layer except for first and second portions of said second insulating mask layer, said first portion of said second insulating mask overlaying a first precisely defined area where said first insulating mask extends from said first region to said third region of second conductivity type, and said second portion of said second insulating mask overlaying a second precisely defined area where said first insulating mask extends from said third region to said fifth region of said second conductivity type;
F. introducing impurities of said first type into the entire planar surface area of said semiconductor substrate other than said first and second precisely defined areas;
G. removing the entire exposed area of said first insulating mask layer of material;
H. removing said first and second portions of said second insulating mask layer, whereby except for said first and second precisely defined areas, said entire planar surface of said semiconductor substrate is exposed;
I. forming a relatively thick third layer of insulating material overlaying said entire planar surface except said first and second precisely defined areas of said planar surface;
J. introducing impurities of said first conductivity type into said first precisely defined area of said planar surface to provide said second region of said first conductivity type;
K. introducing impurities of said second conductivity type into said second precisely defined area of said planar surface to provide said fourth region of said second conductivity type; L. fabricating electrical contacts for the device upon said relatively thick third layer of insulating material, certain of said electrical contacts making direct electrical contact with said first, third and fifth regions of said device, others of said electrical contacts being capacitively coupled to said second and fourth regions of said device.

11. In a method for fabricating a semiconductor device as recited in claim 10 wherein:

said first insulating mask layer comprises a layer of silicon nitride approximately 400 A in thickness superimposed upon a layer of silicon dioxide approximately 500 A in thickness; said first and second portions of said second insulating mask layer are respectively silicon dioxide approximately 10,000 A in thickness; and said relatively thick third layer of insulating material is silicon dioxide approximately 6,500 A in thickness.

12. In a method for fabricating a semiconductor device as recited in claim 11, wherein subsequent to step (i) and prior to step (j) the following steps are performed:

i-1. said 400 A thick layer of silicon nitride is removed,
i-2. said 500 A thick layer of silicon dioxide is removed, and
i-3. a fresh relatively thin layer of silicon dioxide is formed over the entire planar surface of the device whereby said first and second precisely defined areas of said planar surface are respectively overlayed solely with a layer of silicon dioxide of approximatley 500 A in thickness.

13. In a method for fabricating a semiconductor device as claimed in claim 12 wherein: in step (d) said impurities of said second conductivity type are introduced by arsenic capsule diffusion; in step (f) said impurities of said first type are introduced by implanting boron ions, $2 \times 10^{13}$ boron ions/cm$^2$ at 110 keV; in step (j) said impurities of said first conductivity type are introduced by implanting boron ions, $7.9 \times 10^{11}$ boron ions/cm$^2$ at 30 keV; and in step (k) said impurities of said second conductivity type are introduced by implanting phosphorous ions $2.4 \times 10^{12}$ phosphorous ions/cm$^2$ at 95 keV.

14. In a method for fabricating a semiconductor device as recited in claim 13 where, in step (f), the implantation of boron ions provides field protection of field effect transistors fabricated in accordance with the method of claim 13.

15. In a method for fabricating a semiconductor device as recited in claim 12 further characterized by: in step (c) said first, second and third discrete windows are formed only in said second mask layer; in step (d) said impurities of said second conductivity type are introduced by implanting phosphorous ions, $5 \times 10^{15}$ phosphorous ions/cm$^2$ at 150 keV; in step (f) said impurities of said first conductivity type are introduced by implanting boron ions $2 \times 10^{13}$ boron ions/cm$^2$ at 110 keV; in step (j) said impurities of said first conductivity type are introduced by implanting boron ions, $7.9 \times 10^{11}$ boron ions/cm$^2$ at 30 keV: and in step (k) said impurities of said second conductivity type are introduced by implanting phosphorous ions, $2.4 \times 10^{12}$ phosphorous ions/cm$^2$ at 95 keV.

16. In a method for fabricating a semiconductor device on a semiconductor substrate of a first conductivity type having at least one planar surface, said method including the following steps:

A. forming a first layer of oxidation resistant material over the entire planar surface of said semiconductor substrate;
B. forming a second layer of material on said entire first layer with the exception of at least first and second adjacently spaced regions of said first layer;
C. subjecting said first and second regions of said first layer to Ion implantation by Ions of said second conductivity type, whereby first and second regions of a second conductivity type are formed on and beneath said planar surface of said semiconductor substrate and beneath said first and second adjacently spaced regions of said first layer of oxidation resistant material;

D. removing said second layer of material;

E. forming a third layer of material in a third region on said first layer, said third region extending from said first region to said second region of said first layer, said third region of said third layer overlaying a third region on said planar surface extending from said first region of second conductivity type to said second region of second conductivity type;

F. subjecting said first layer, except for the third region thereof underlying said third layer to ion bombardment by ions of said first conductivity type whereby except for said third region on said planar surface of said semiconductor substrate, the entire planar surface of said semiconductor substrate has been subjected to Ion implantation by Ions of said first conductivity type;

G. removing said first layer except for the remaining portion of said first layer underlying said third layer;

H. removing said third layer;

I. thermally oxidizing the planar surface of said semiconductor substrate with the exception of the remaining portion said first layer which overlies said third region of said planar surface of said semiconductor substrate, whereby an insulating layer is formed over the entire exposed area of said planar surface of said semiconductor substrate;

K. and providing electrical contacts to said device.

17. In the method of claim 16 wherein said first layer is silicon nitride.

18. In the method of claim 16 wherein said first layer is aluminum oxide.

19. In the method of claim 16 wherein said second layer is silicon dioxide.

20. In the method of claim 16 wherein said second layer is photo resist.

21. In the method of claim 16 wherein said second layer is aluminum.

22. In the method of claim 16 wherein said first layer is comprised of a layer of silicon nitride on a layer of silicon dioxide.

23. In the method of claim 16 wherein said third layer is silicon dioxide.

24. In the method of claim 16 wherein said third layer is photo resist.

25. In the method of claim 16 wherein the sequence of performing steps F and G is reversed.

26. In the method of claim 16 wherein said second layer is comprised of a layer of photo resist on a thin layer of silicon dioxide.

27. In the method of claim 26 wherein only the photo resist is removed in step D.

28. In the method of claim 16 wherein subsequent to step I and prior to step K said portion of said first layer is removed and a fresh insulating layer is formed.

29. In the method of claim 16 wherein said third region on said planar surface of said semiconductor substrate is subjected to Ion implantation by Ions of either said first or said second conductivity type prior to step K.

30. In a method for fabricating a semiconductor device on a semiconductor substrate of a first conductivity type having at least one planar surface, said method including the following steps:

A. forming a first layer of oxidation resistant material over the entire planar surface of said semiconductor substrate;

B. forming a second layer of material on said entire first layer with the exception of at least first and second adjacently spaced regions of said first layer;

C. removing at least said first and second regions of said first layer whereby first and second regions of said planar surface of said semiconductor substrate are exposed;

D. diffusing an impurity of a second conductivity type into at least said first and second regions of said planar surface of said semiconductor substrate, whereby first and second regions of said second conductivity type are formed on and beneath said planar surface of said semiconductor substrate;

E. removing said second layer of material;

F. forming a third layer of material in a third region of said first layer, said third region extending from said first region on said planar surface of said semiconductor substrate to said second region on said planar surface of said semiconductor substrate;

G. subjecting said planar surface of said semiconductor substrate with the exception of the third region thereof which underlies said third layer of Ion bombardment by Ions of said first conductivity type whereby except for said third region on said planar surface of said semiconductor substrate has been subjected to Ion implantation by Ions of said first conductivity type;

H. removing said first layer except for the remaining portion of said first layer underlying said third layer;

I. removing said third layer;

J. thermally oxidizing the planar surface of said semiconductor substrate with the exception of said remaining portion of said first layer which overlies said third region of said planar surface of said semiconductor substrate, whereby an insulating layer is formed over the entire exposed surface area of said planar surface of said semiconductor substrate;

K. and providing electrical contacts to said device.

31. In the method of claim 30 wherein said first layer is silicon nitride.

32. In the method of claim 30 wherein said first layer is aluminum oxide.

33. In the method of claim 30 wherein said second layer is silicon dioxide.

34. In the method of claim 30 wherein said second layer is photo resist.

35. In the method of claim 30 wherein said second layer is aluminum.

36. In the method of claim 30 wherein said first layer is comprised of a layer of silicon nitride on a layer of silicon dioxide.

37. In the method of claim 30 wherein said third layer is silicon dioxide.

38. In the method of claim 30 wherein said third layer is photo resist.

39. In the method of claim 30 wherein the order of execution of steps F and G is reversed.

40. In the method of claim 30 wherein said second layer is comprised of a layer of photo resist on a thin layer of silicon dioxide.

41. In the method of claim 40 wherein only the photoresist is removed in step D.

42. In the method of claim 30 wherein subsequent to step I and prior to step K said portion of said first layer is removed and a fresh insulating layer is formed.

43. In the method of claim 30 wherein said third region on said planar surface of said semiconductor substrate is subjected to Ion implantation by Ions of either said first or said second conductivity type prior to step K.

* * * * *

UNITED STATES PATENT OFFICE

CERTIFICATE OF CORRECTION

PATENT NO. : 3,873,372

DATED : March 25, 1975

INVENTOR(S) : William S. Johnson

It is certified that error appears in the above-identified patent and that said Letters Patent are hereby corrected as shown below:

Claim 9, Col. 16, line 5 change "of" to - - on - -.

Claim 16, Col. 19, line 4 change "of" to - - on - -.

Claim 30, Col. 20, line 16 change "of" to - - on - -.

Signed and Sealed this

*twenty-third* Day of *March 1976*

[SEAL]

*Attest:*

RUTH C. MASON
*Attesting Officer*

C. MARSHALL DANN
*Commissioner of Patents and Trademarks*